United States Patent
Tay et al.

(10) Patent No.: US 11,211,041 B2
(45) Date of Patent: Dec. 28, 2021

(54) MESH ASSEMBLIES, COMPUTING SYSTEMS, AND METHODS FOR MANUFACTURING A MESH ASSEMBLY

(71) Applicant: RAZER (ASIA-PACIFIC) PTE. LTD., Singapore (SG)

(72) Inventors: Cher Siang Tay, Singapore (SG); Peng Sing Gay, Singapore (SG)

(73) Assignee: RAZER (ASIA-PACIFIC) PTE. LTD., Singapore (SG)

( * ) Notice: Subject to any disclaimer, the term of this patent is extended or adjusted under 35 U.S.C. 154(b) by 590 days.

(21) Appl. No.: 16/064,960

(22) PCT Filed: Dec. 22, 2015

(86) PCT No.: PCT/SG2015/050499
§ 371 (c)(1),
(2) Date: Jun. 21, 2018

(87) PCT Pub. No.: WO2017/111695
PCT Pub. Date: Jun. 29, 2017

(65) Prior Publication Data
US 2019/0027125 A1    Jan. 24, 2019

(51) Int. Cl.
*G10K 11/162* (2006.01)
*G06F 1/20* (2006.01)
(Continued)

(52) U.S. Cl.
CPC ........ *G10K 11/162* (2013.01); *F04D 25/0613* (2013.01); *F04D 29/664* (2013.01);
(Continued)

(58) Field of Classification Search
CPC .. F24F 2013/242; F24F 13/24; G10K 11/162; G06F 1/20
See application file for complete search history.

(56) References Cited

U.S. PATENT DOCUMENTS 1,955,479 A * 4/1934 Weinberger ............. F04D 25/14
454/338
2,132,642 A * 10/1938 Parsons ..................... E04B 1/86
428/137
(Continued)

FOREIGN PATENT DOCUMENTS

| CN | 1464353 A | 12/2003 |
|---|---|---|
| CN | 1754201 A | 3/2006 |

(Continued)

OTHER PUBLICATIONS

NIST, Glossary of Key Information Security Terms, May 2013, NISTIR Revision 2, p. 144, <https://nvlpubs.nist.gov/nistpubs/ir/2013/NIST.IR.7298r2.pdf> (Year: 2013).*

(Continued)

*Primary Examiner* — Forrest M Phillips
(74) *Attorney, Agent, or Firm* — Polsinelli PC

(57) ABSTRACT

According to various embodiments, a mesh assembly may be provided. The mesh assembly may include: a first mesh including a plurality of first holes arranged according to a pattern; a second mesh including a plurality of second holes arranged according to the pattern; wherein the second mesh is provided on top of the first mesh; and wherein at least one hole of the plurality of first holes is at least partially obstructed by the second mesh.

18 Claims, 15 Drawing Sheets

(51) Int. Cl.
*G06F 1/16* (2006.01)
*H02K 5/24* (2006.01)
*H05K 7/20* (2006.01)
*G10K 11/16* (2006.01)
*F04D 25/06* (2006.01)
*F04D 29/66* (2006.01)
*F24F 13/24* (2006.01)

(52) U.S. Cl.
CPC ............ *F24F 13/24* (2013.01); *G06F 1/1656* (2013.01); *G06F 1/20* (2013.01); *G10K 11/161* (2013.01); *H02K 5/24* (2013.01); *H05K 7/20145* (2013.01); *F24F 2013/242* (2013.01)

(56) References Cited

U.S. PATENT DOCUMENTS

| | | | |
|---|---|---|---|
| 2,645,301 A * | 7/1953 | De Vries | H04R 1/22 181/290 |
| 5,199,846 A | 4/1993 | Fukasaku et al. | |
| 5,862,037 A | 1/1999 | Behl | |
| 6,268,038 B1 * | 7/2001 | Porte | G10K 11/162 428/116 |
| 6,459,578 B1 * | 10/2002 | Wagner | H05K 7/20145 165/104.33 |
| 6,687,123 B2 | 2/2004 | Kitahara | |
| 7,492,588 B2 | 2/2009 | Hwang et al. | |
| 7,694,779 B2 | 4/2010 | Takayasu | |
| 8,739,927 B2 * | 6/2014 | Kang | E04B 1/8409 181/294 |
| 8,863,894 B2 * | 10/2014 | Kato | F04D 29/664 181/224 |
| 9,708,811 B2 * | 7/2017 | Hsieh | G10K 11/16 |
| 2005/0161280 A1 * | 7/2005 | Furuya | F01N 1/003 181/225 |
| 2005/0276684 A1 | 12/2005 | Huang et al. | |
| 2006/0096183 A1 | 5/2006 | Yamaguchi et al. | |
| 2006/0131101 A1 | 6/2006 | Crocker et al. | |
| 2007/0134626 A1 | 6/2007 | Hall | |
| 2010/0157533 A1 | 6/2010 | Oniki et al. | |
| 2011/0100749 A1 | 5/2011 | Nonogi et al. | |
| 2011/0159797 A1 | 6/2011 | Beltman et al. | |
| 2013/0087408 A1 | 4/2013 | Mäder | |
| 2013/0168180 A1 * | 7/2013 | Merchant | F02C 7/045 181/214 |
| 2013/0189458 A1 * | 7/2013 | Andre | B05D 3/12 428/34.1 |
| 2013/0286581 A1 | 10/2013 | MacDonald | |
| 2013/0343589 A1 | 12/2013 | Thomason et al. | |
| 2015/0003007 A1 | 1/2015 | MacDonald et al. | |

FOREIGN PATENT DOCUMENTS

| | | |
|---|---|---|
| CN | 2904039 Y | 5/2007 |
| CN | 102089801 A | 6/2011 |
| CN | 102186327 A | 9/2011 |
| CN | 201993700 U | 9/2011 |
| CN | 102640073 A | 8/2012 |
| CN | 102890559 A | 1/2013 |
| CN | 102968160 A | 3/2013 |
| CN | 103021398 A | 4/2013 |
| CN | 104471637 A | 3/2015 |
| CN | 204360300 U | 5/2015 |
| JP | H0291695 A | 3/1990 |
| JP | 2005236163 A | 9/2005 |
| WO | WO 2004/061817 A1 | 7/2004 |
| WO | WO 2007/134626 | 11/2007 |
| WO | WO2011047094 A2 | 4/2011 |

OTHER PUBLICATIONS

Office Action (including English Translation) dated Mach 31, 2020, for the corresponding Taiwanese Application No. 105142045 in 24 total pages.

International Search Report and Written Opinion, dated Sep. 13, 2016, for the corresponding International Application No. PCT/SG2015/050499 in 10 pages.

Extended European Search Report dated Nov. 19, 2018, 17 pages, for the corresponding European Patent Application No. 15911466.9.

Unknown: "Random holes pattern from metal sheets", Nov. 22, 2014, XP055521595, Retrieved from the Internet: URL:https://www.dreamstime.com/stock-photo-holes-not-lined-up-two-metal-sheets-them-one-above-other-giving-random-chaotic-look-image59603736.

European Examination Report dated May 13, 2020, 11 pages, for the corresponding European Patent Application No. 15911466.9.

Office Action (including English Translation) dated Nov. 23, 2020, for the corresponding Chinese Application No. 201580085785.X in 17 total pages.

* cited by examiner

118
Provide a first mesh inlcuding a plurality of first holes arranged according to a pattern 120
Provide on top of the first mesh a second mesh including a plurality of second holes arranged according to the pattern so that at least one hole of the plurality of first holes is at least partially obstructed by the second mesh

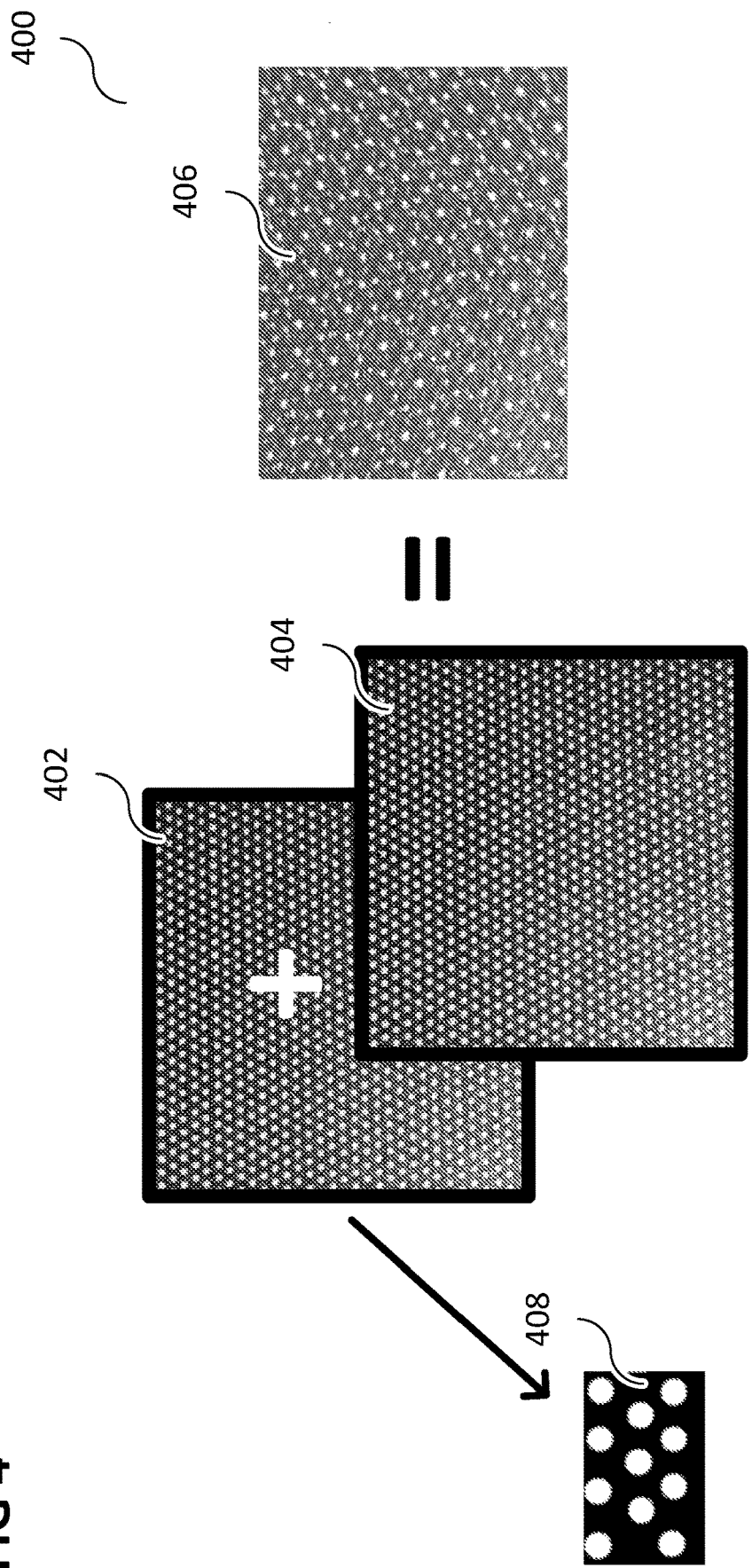

MESH ASSEMBLIES, COMPUTING SYSTEMS, AND METHODS FOR MANUFACTURING A MESH ASSEMBLY

TECHNICAL FIELD

Various embodiments generally relate to mesh assemblies, computing systems, and methods for manufacturing a mesh assembly.

BACKGROUND

When fans (for example of computing systems) are spinning at high rpm, annoying whine noise may be produced. This audible whine noise source may be coming from fan blades and its frequency may be related to the number of blades inside a fan and to the rpm (rotations per minute) the fan. Thus, thus may be a need for devices which remove the annoying whine noise when fans are spinning at high rpm.

SUMMARY OF THE INVENTION

According to various embodiments, a mesh assembly may be provided. The mesh assembly may include: a first mesh including a plurality of first holes arranged according to a pattern; a second mesh including a plurality of second holes arranged according to the pattern; wherein the second mesh is provided on top of the first mesh; and wherein at least one hole of the plurality of first holes is at least partially obstructed by the second mesh.

According to various embodiments, a computing system may be provided. The computing system may include: a housing with an opening; a fan; and the mesh assembly provided between the fan and the opening.

According to various embodiments, a method for manufacturing a mesh assembly may be provided. The method may include: providing a first mesh including a plurality of first holes arranged according to a pattern; providing on top of the first mesh a second mesh including a plurality of second holes arranged according to the pattern so that at least one hole of the plurality of first holes is at least partially obstructed by the second mesh.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. The dimensions of the various features or elements may be arbitrarily expanded or reduced for clarity. In the following description, various embodiments of the invention are described with reference to the following drawings, in which:

FIG. 1C shows a flow diagram illustrating a method for manufacturing a mesh assembly according to various embodiments;

FIG. 4 shows an illustration of details of a mesh assembly according to various embodiments;

DETAILED DESCRIPTION

Figure 1A:
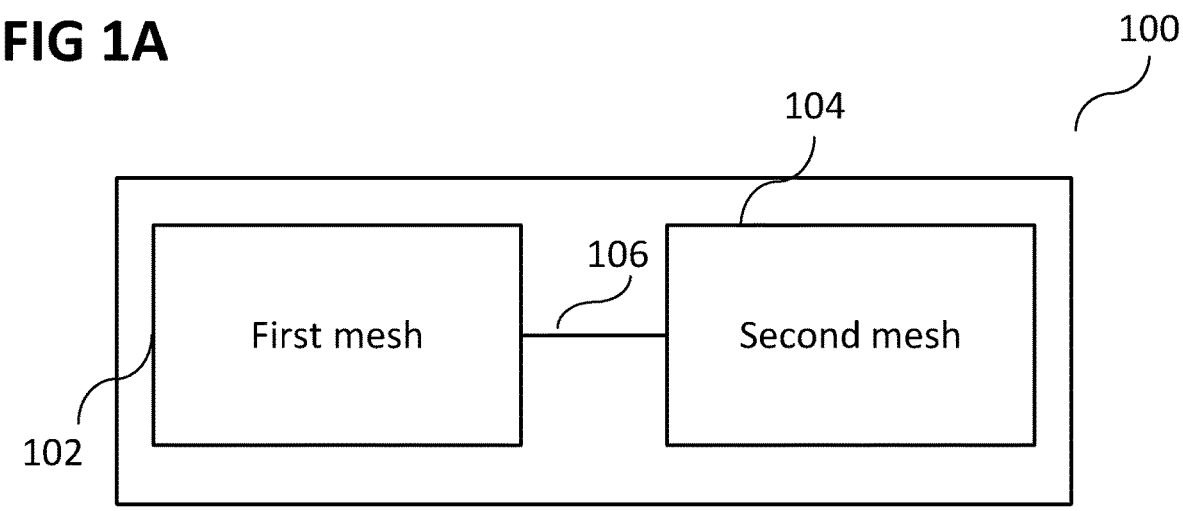
FIG. 1A shows a mesh assembly according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In the specification the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

The reference to any prior art in this specification is not, and should not be taken as an acknowledgement or any form of suggestion that the referenced prior art forms part of the common general knowledge in Australia (or any other country).

In order that the invention may be readily understood and put into practical effect, particular embodiments will now be described by way of examples and not limitations, and with reference to the figures.

Various embodiments are provided for devices, and various embodiments are provided for methods. It will be understood that basic properties of the devices also hold for the methods and vice versa. Therefore, for sake of brevity, duplicate description of such properties may be omitted.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

The term "coupled" (or "connected") herein may be understood as electrically coupled or as mechanically coupled, for example attached or fixed or attached, or just in contact without any fixation, and it will be understood that both direct coupling or indirect coupling (in other words: coupling without direct contact) may be provided.

When fans (for example of computing systems) are spinning at high rpm, annoying whine noise may be produced. This audible whine noise source may be coming from fan blades and its frequency may be related to the number of blades inside a fan and to the rpm (rotations per minute) the fan. A current solution may be to seal the keypad top side which may not allow free air flow or to use sound absorbing foam which may not be possible for ultra thin system.

Thus, devices may be provided which improve removing the annoying whine noise when fans are spinning at high rpm.

According to various embodiments, devices may be provided for fan noise suppression, for example for an ultra thin system, for example for a laptop or notebook device.

According to various embodiments, a noise attenuator may be added in an ultra thin product such as notebook (for example a notebook which uses brushless fans).

FIG. 1A shows a mesh assembly 100 according to various embodiments. The mesh assembly 100 may include a first mesh 102 including a plurality of first holes arranged according to a pattern. The mesh assembly 100 may further include a second mesh 104 including a plurality of second holes arranged according to the (same) pattern. The second mesh 104 may be provided on top of the first mesh 102. At least one hole of the plurality of first holes may be at least partially obstructed by the second mesh 104. The first mesh 102 and the second mesh 104 may be coupled with each other, like indicated by line 106, for mechanically coupled.

According to various embodiments, the first mesh 102 may be attached to the second mesh 104 using double sided adhesives (for example at an external perimeter of a fan blades area).

In other words, a mesh assembly may be provided which includes two identical meshes which are stacked (or overlaid or provided on top of each other), and for which the orientation of the first mesh is different from the orientation of the second mesh.

According to various embodiments, the pattern may include or may be a pattern in which each hole is provided at a pre-determined distance from a closest further hole.

According to various embodiments, the distance may be in a range between 0.01 mm and 0.1 mm.

According to various embodiments, the distance may be at least substantially equal to 0.04 mm.

According to various embodiments, the pattern may include a pattern in which each hole is provided at a pre-determined distance from all neighboring holes.

According to various embodiments, the first mesh 102 may include or may be a metal mesh. According to various embodiments, the second mesh 104 may include or may be a metal mesh. According to various embodiments, the first mesh 102 and/or the second mesh 104 may include or may be made from PE (polyethylene). The first mesh 102 and/or the second mesh 104 may have a thickness in a range of 0.1 mm to 1 mm, for example at least substantially 0.4 mm.

According to various embodiments, each hole of the first mesh 102 and each hole of the second mesh 104 may have a diameter in a range of 0.01 mm to 0.1 mm.

According to various embodiments, each hole of the first mesh 102 and each hole of the second mesh 104 may have a diameter at least substantially equal to 0.06 mm.

According to various embodiments, the pattern may include or may be a pattern in which an angle between a center of a hole and two corresponding centers of two neighboring holes of the hole is in a range of 30 degrees to 90 degrees.

According to various embodiments, the pattern may include or may be a pattern in which an angle between a center of a hole and two corresponding centers of two neighboring holes of the hole is at least substantially 60 degrees.

According to various embodiments, the pattern may include or may be a repetitive pattern.

According to various embodiments, the pattern may include or may be a regular pattern.

According to various embodiments, at least one hole of the first mesh 102 and at least one hole of the second mesh 104 may be aligned. The first mesh 102 and the second mesh 104 may be rotated by a pre-determined angle with respect to the pattern.

According to various embodiments, the pre-determined angle may be in a range of −150 degrees to 150 degrees.

According to various embodiments, the pre-determined angle may be at least substantially −90 degrees or at least substantially 90 degrees.

Figure 1B:
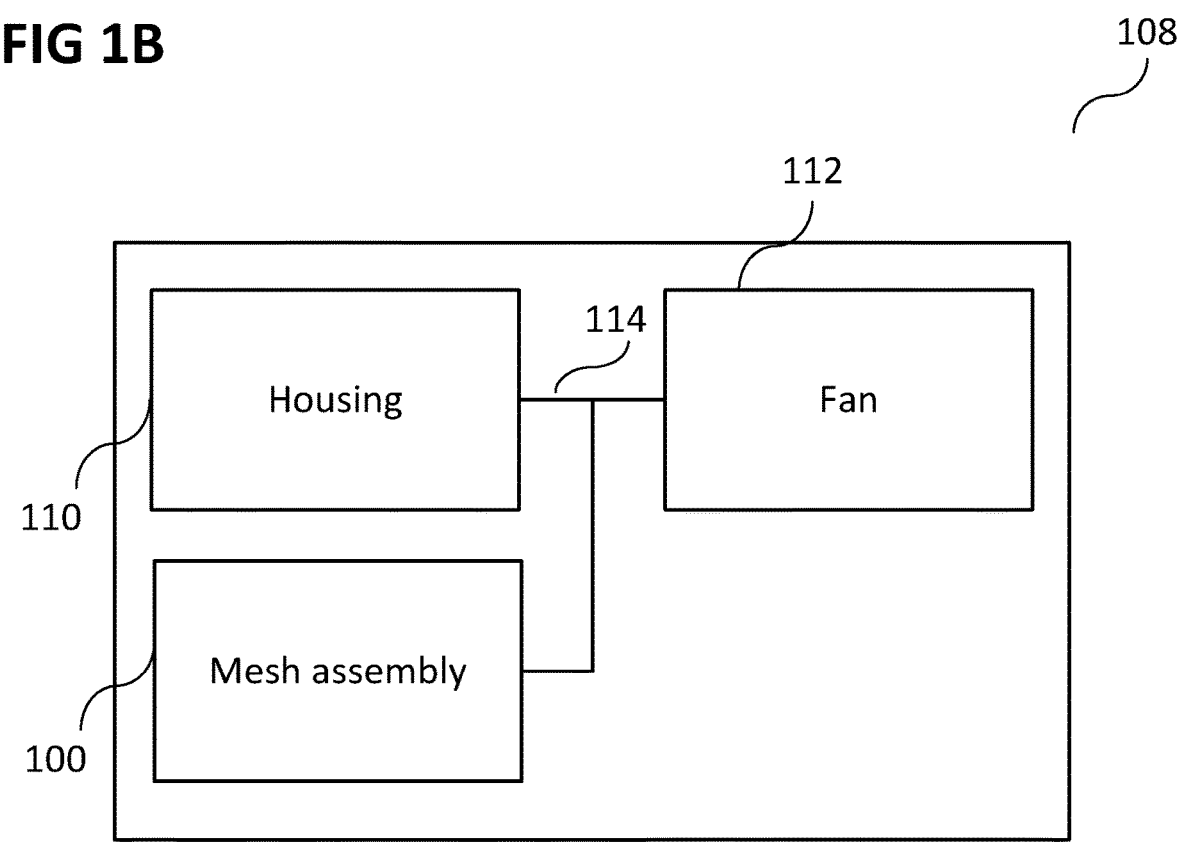
FIG. 1B shows a computing system according to various embodiments.

FIG. 1B shows a computing system 108 according to various embodiments. The computing system 108 may include a housing 110 with an opening. The computing system 108 may further include a fan 112. The computing system 108 may further include a mesh assembly (for example the mesh assembly 100 like described with reference to FIG. 1A). The mesh assembly may be provided between the fan 112 and the opening (of the housing 110).

The housing 110, the fan 112, and the mesh assembly may be coupled with each other, like indicated by lines 114, for example-mechanically coupled.

FIG. 1C shows a flow diagram 116 illustrating a method for manufacturing a mesh assembly according to various embodiments. In 118, a first mesh including a plurality of first holes arranged according to a pattern may be provided. In 120, on top of the first mesh, a second mesh including a plurality of second holes arranged according to the pattern may be provided so that at least one hole of the plurality of first holes is at least partially obstructed by the second mesh.

According to various embodiments, only a centric hole of the plurality of holes of the first mesh and of the second mesh may be (entirely) unblocked. It will be understood that with a regular structure of the first mesh and of the second mesh, there may be a plurality of centric holes which are (entirely) unblocked.

According to various embodiments, the pattern may include or may be a pattern in which each hole is provided at a pre-determined distance from a closest further hole.

According to various embodiments, the distance may be in a range between 0.01 mm and 0.1 mm.

According to various embodiments, the distance may be at least substantially equal to 0.04 mm.

According to various embodiments, the pattern may include or may be a pattern in which each hole is provided at a pre-determined distance from all neighboring holes.

According to various embodiments, the first mesh may include a metal mesh. According to various embodiments, the second mesh may include a metal mesh.

According to various embodiments, each hole of the first mesh and each hole of the second mesh may be a diameter in a range of 0.01 mm to 0.1 mm.

According to various embodiments, each hole of the first mesh and each hole of the second mesh may have a diameter at least substantially equal to 0.06 mm.

According to various embodiments, the pattern may include or may be a pattern in which an angle between a center of a hole and two corresponding centers of two neighboring holes of the hole is in a range of 30 degrees to 90 degrees.

According to various embodiments, the pattern may include or may be a pattern in which an angle between a center of a hole and two corresponding centers of two neighboring holes of the hole is at least substantially 60 degrees.

According to various embodiments, the pattern may include or may be a repetitive pattern.

According to various embodiments, the pattern may include or may be a regular pattern.

According to various embodiments, at least one hole of the first mesh and at least one hole of the second mesh may be aligned. According to various embodiments, the first mesh and the second mesh may be rotated by a pre-determined angle with respect to the pattern.

According to various embodiments, the pre-determined angle may be in a range of −150 degrees to 150 degrees.

According to various embodiments, the pre-determined angle may be at least substantially −90 degrees or at least substantially 90 degrees.

Figure 2:
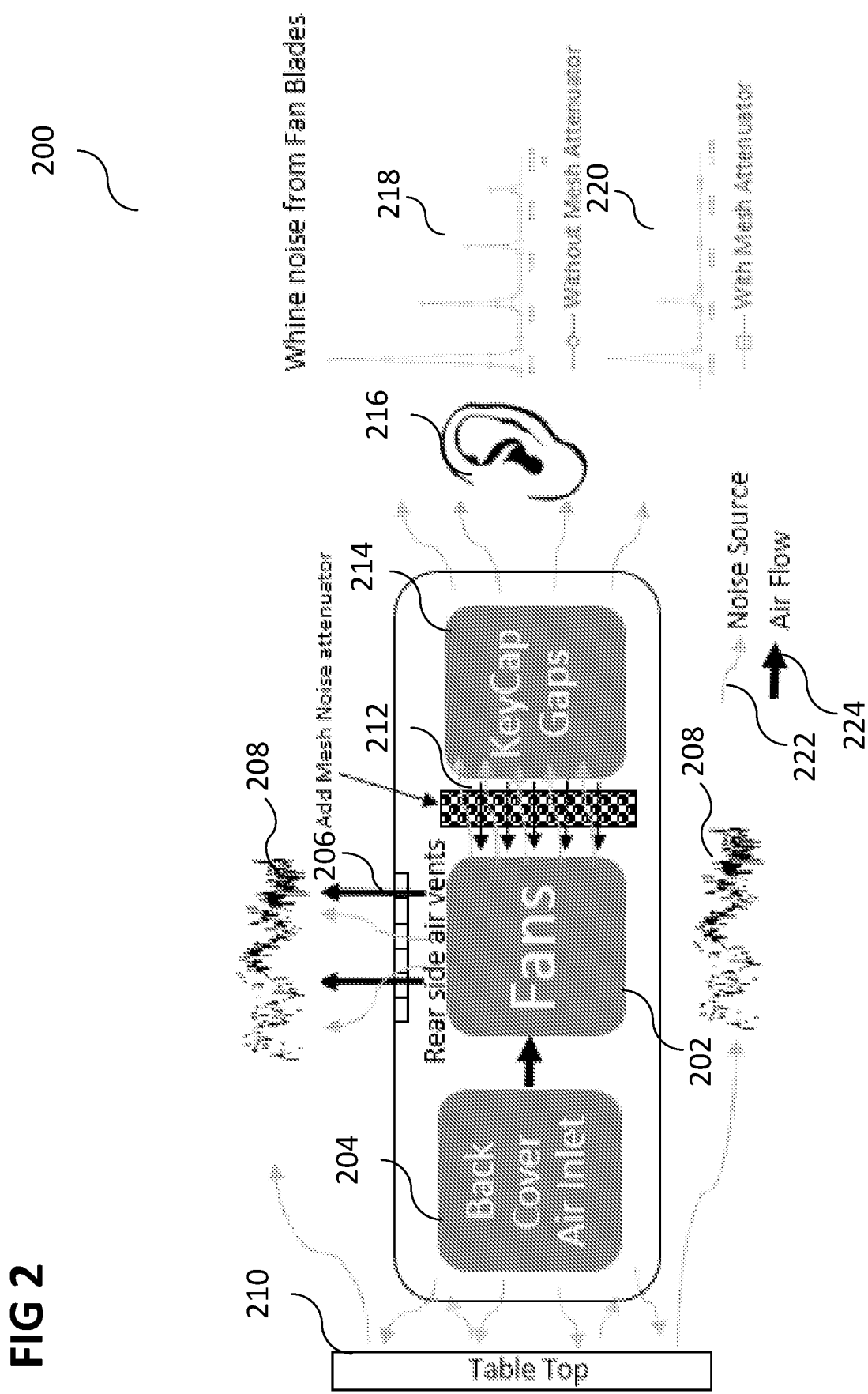
FIG. 2 shows a block diagram of a system with a keypad and fans according to various embodiments.

FIG. 2 shows a block diagram 200 of a system with a keypad (and corresponding key cap gaps 214) and fans 202 according to various embodiments. The fans 202 may draw air through a back cover air inlet 204 and (via a mesh noise attenuator 212 according to various embodiments) through the keycap gaps 214, and may exhaust air through rear side air vents 206. Noise from the back cover air inlet 204 may be reflected by a table top 210 on which the system (for example computing system; for example laptop device) may be provided, and noise 208 may be thus provided to a user's ear 216. Noise emitted through the keycap gaps 214 may be directly provided to the user's ear 216. In FIG. 2, thin arrows 222 indicate a noise source (or a noise emission), and this arrows 224 indicate air flow. A diagram 218 illustrates whine noise from fan blades without a mesh attenuator. A diagram 220 illustrates whine noise from fan blades with a mesh attenuator 212 according to various embodiments.

Figure 3A:
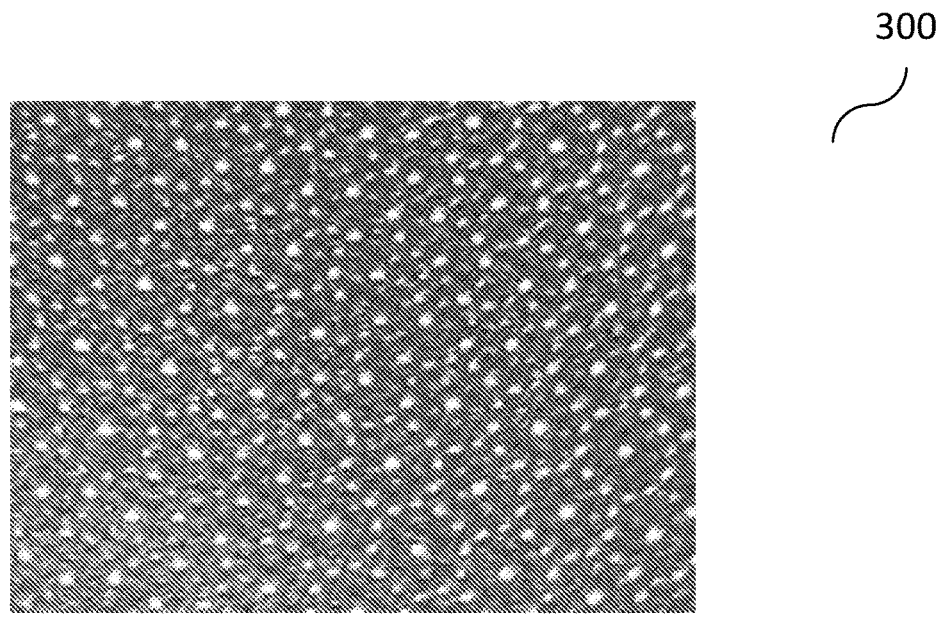
FIG. 3A shows an illustration of a mesh assembly according to various embodiments.
Figure 3B:
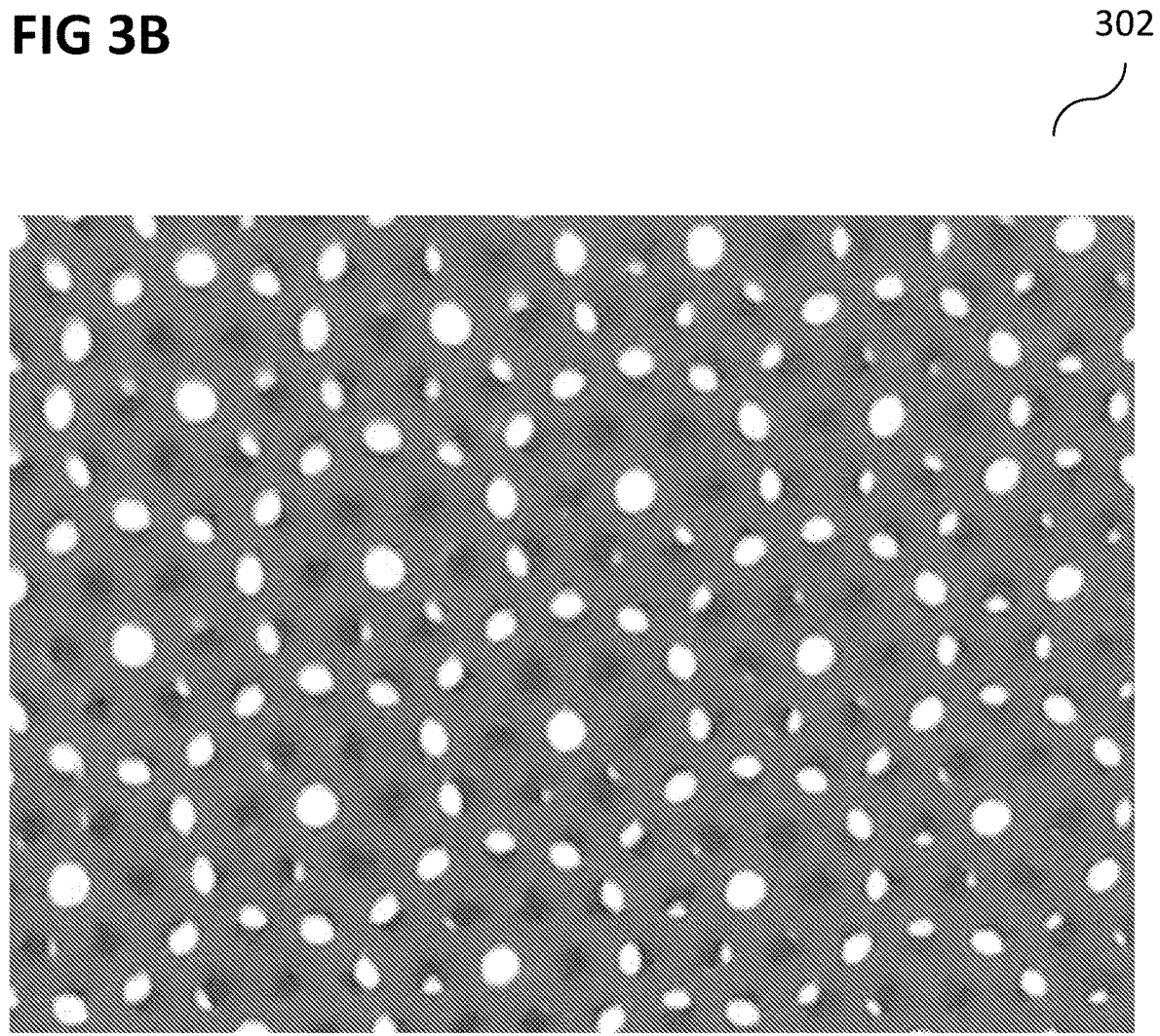
FIG. 3B shows an enlarged view of the mesh assembly according to various embodiments.

FIG. 3A shows an illustration 300 of a mesh assembly according to various embodiments. FIG. 3B shows an enlarged view 302 of the mesh assembly according to various embodiments.

According to various embodiments, the mesh may be created (in other words: produced; in other words: manufactured) from two simple thin mesh metal sheets, for example two metal sheets with a regular pattern of circular holes.

According to various embodiments, the mesh may attenuate a fan fundamental blade frequency and may suppress all harmonics to low levels and remove whine annoying noise when fan is in high rpm mode.

According to various embodiments, air vent holes may be created from a simple mesh. The air vent holes may attenuate noise, and at the same time may allow air flow. The mesh according to various embodiments may provide a flat surface and does not cause interference to the fan blades.

According to various embodiments, the mesh may be suitable for very thin products, and may provide a stack up height requirement of less than 0.5 mm.

According to various embodiments, the mesh may provide for easy implementation and low cost.

FIG. 4 shows an illustration 400 of details of a mesh (in other words: mesh assembly) according to various embodiments. Two single meshes (for example a first mesh 402 and a second mesh 404) with a regular pattern of (for example circular) holes may be overlaid. For example, the first mesh 402 and the second mesh 404 may have an at least substantially identical hole pattern. An enlarged view 408 of the hole pattern is shown. The overlay of the two single meshes 402 and 404 may provide a mesh 406 according to various embodiments. According to various embodiments, the holes of the two meshes 402 and 404 may be misaligned.

Figure 5A:
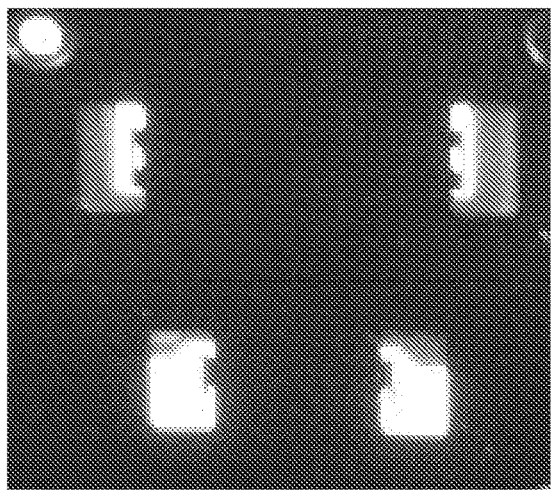
FIG. 5A shows an illustration of key pad holes on a key with no mesh.

FIG. 5A shows an illustration 500 of key pad holes on a key with no mesh.

Figure 5B:
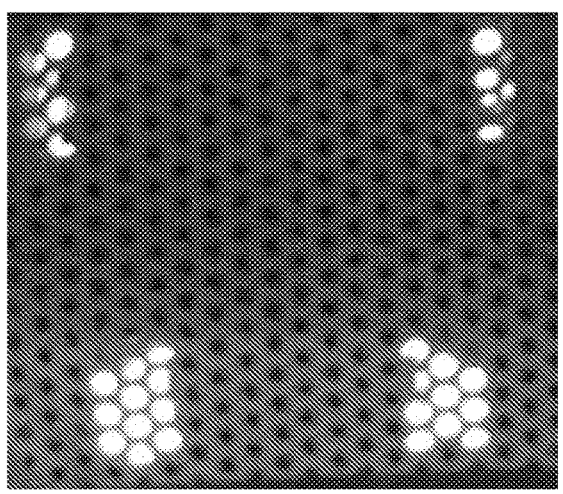
FIG. 5B shows an illustration of key pad holes on a key with a single layer mesh.

FIG. 5B shows an illustration 502 of key pad holes on a key with a single layer mesh.

Figure 5C:
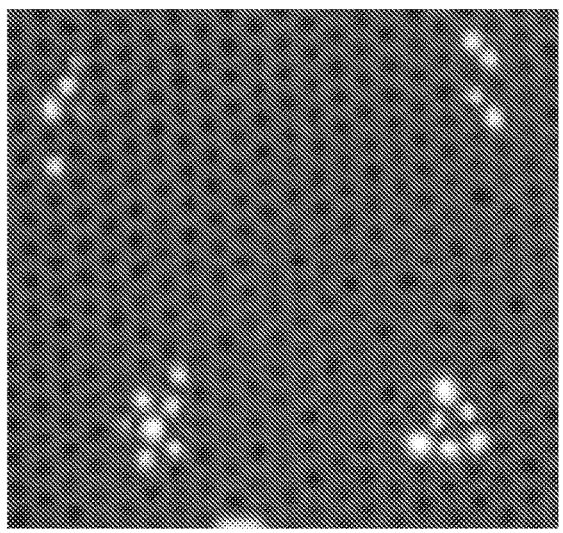
FIG. 5C shows an illustration of key pad holes on a key with a two-layer mesh according to various embodiments.

FIG. 5C shows an illustration 504 of key pad holes on a key with a two-layer mesh according to various embodiments (in other words: key pad holes on a key after sticking the mesh according to various embodiments).

According to various embodiments, the mesh may attenuate whine noise (for example may lower whine noise by 13 dBm). For comparison, a single layer mesh may lower whine noise by 3 dBm only.

Figure 6A:
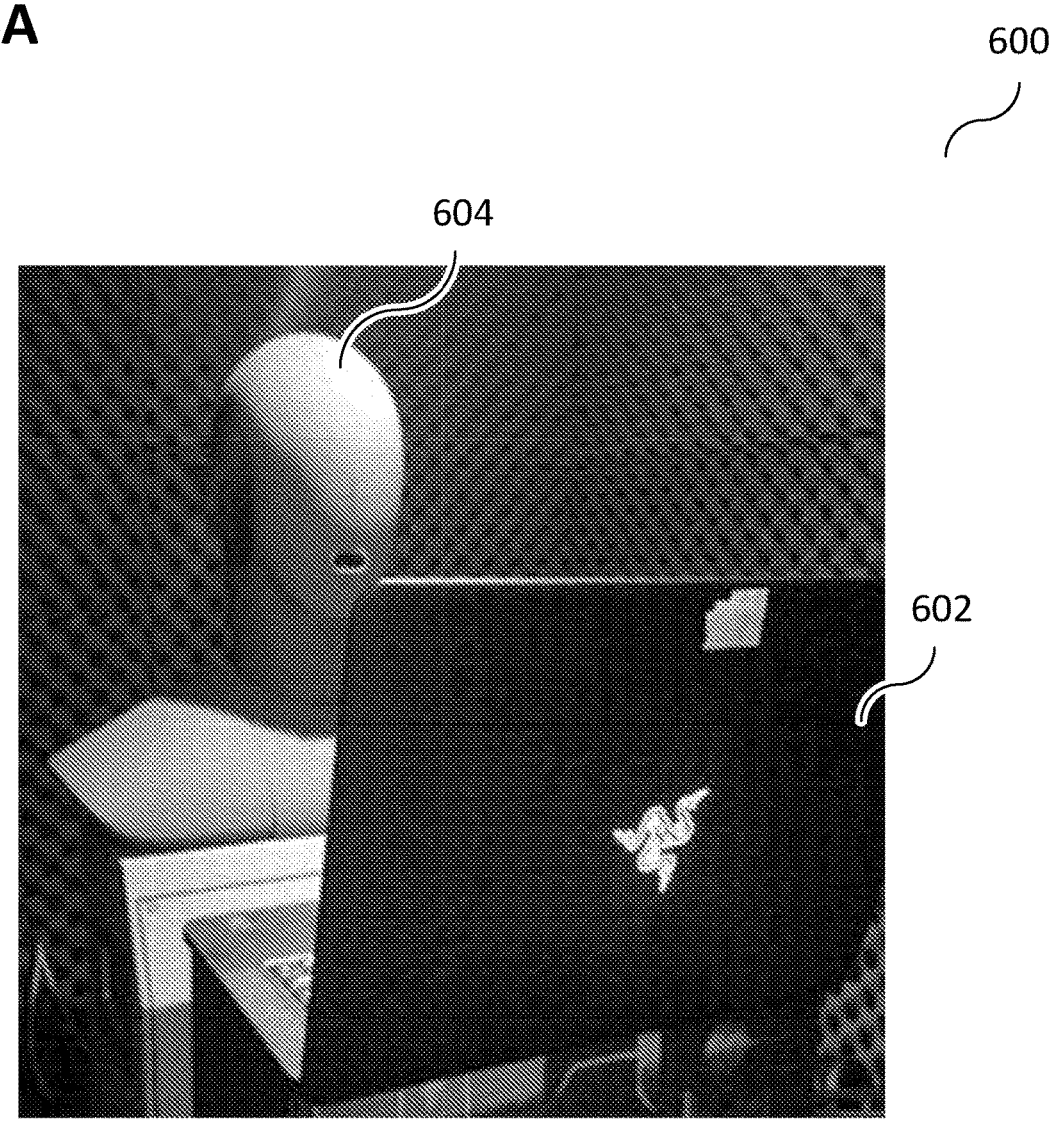
FIG. 6A shows an illustration of a setup for testing a mesh according to various embodiments.

FIG. 6A shows an illustration 600 of a setup for testing a mesh according to various embodiments. A laptop system 602, which is equipped with the mesh according to various embodiments, is provided at a distance of 0.5 m from a user dummy 604. The laptop system 602 may sit on flat surface and may be flipped open. The number of fan blades of the laptop system 602 may be 29, and the fan speed may be between 5500 rpm and 5700 rpm.

Figure 6B:
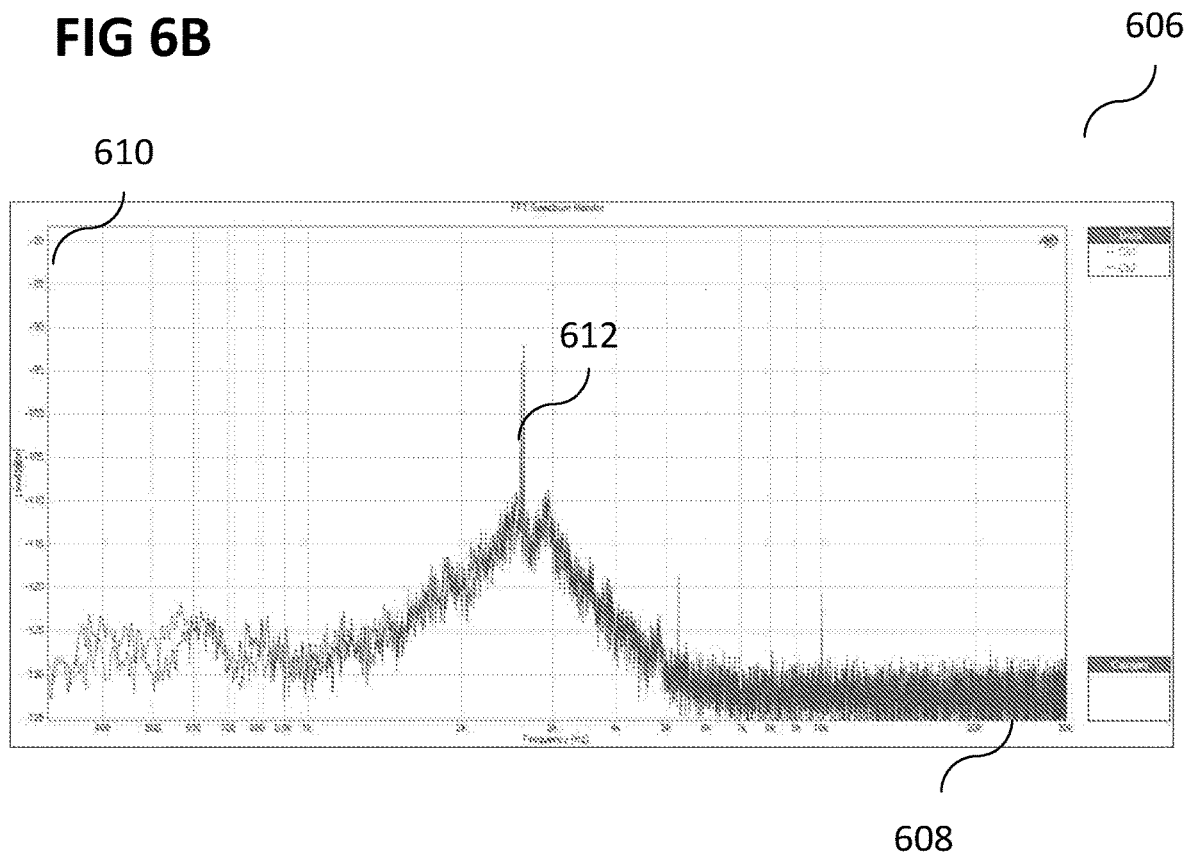
FIG. 6B shows a diagram of measurement results with a laptop system where no mesh assembly is provided at the fan area.

FIG. 6B shows a diagram 606 of measurement results with a laptop system 602 where no mesh assembly is provided at the fan area. A horizontal axis 608 indicates a frequency, and a vertical axis 610 indicates a noise level. A peak 612 may be provided at −92 dBm, and a user may perceive corresponding whine sound.

Figure 6C:
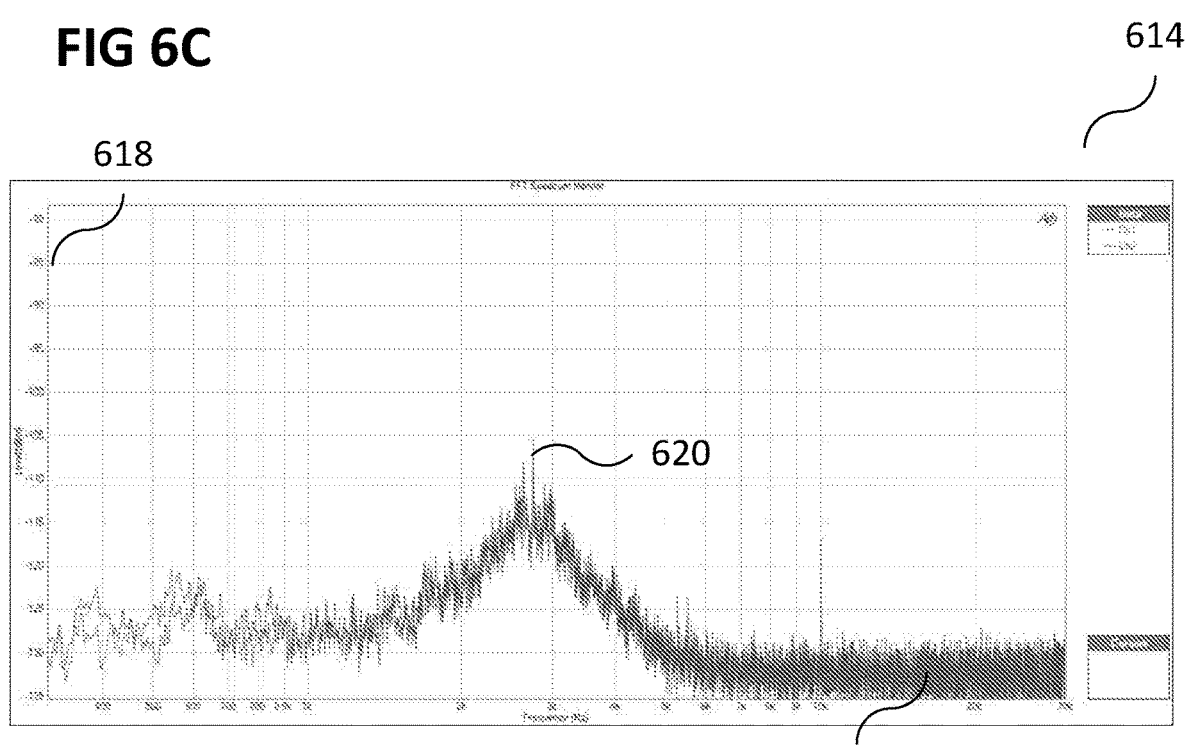
FIG. 6C shows a diagram of measurement results with a laptop system where a mesh assembly according to various embodiments is provided at the fan area.

FIG. 6C shows a diagram 614 of measurement results with a laptop system 602 where a mesh assembly according to various embodiments is provided at the fan area. A horizontal axis 616 indicates a frequency, and a vertical axis 68 indicates a noise level. The peak fundamental frequency drops from −92-105 dBm, like indicated by 620, which may correspond to an improvement of 13 dBm.

Figure 7A:
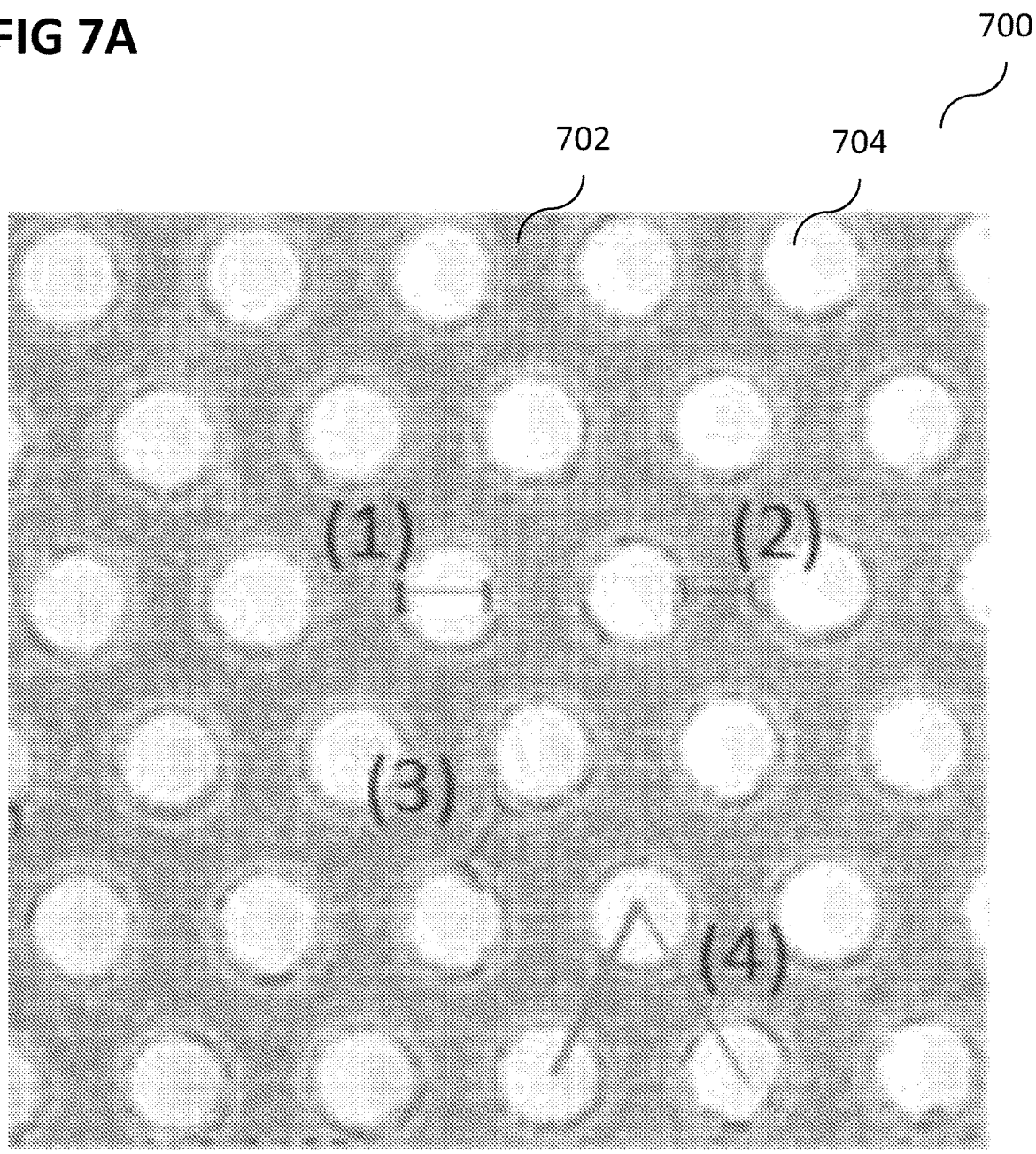
FIG. 7A shows an illustration of a single mesh according to various embodiments.

FIG. 7A shows an illustration 700 of a single mesh according to various embodiments. According to various embodiments, to single meshes like shown in FIG. 7A may be stacked in order to provide a mesh according to various embodiments. The single mesh may include holes (an exemplary hole is labelled 704 in FIG. 7A) in a layer of for example metal. The dimensions of the single mesh may be as follows: the hole diameter (like indicated by (1) in FIG. 7A) may be 0.06 mm. The distance between neighboring holes (like indicated by (2) and (3) in FIG. 7A) may be 0.04 mm. The angle from a center of a hole to the respective centers of two neighboring holes (like indicated by (4) in FIG. 7A) may be 60 degrees.

Figure 7B:
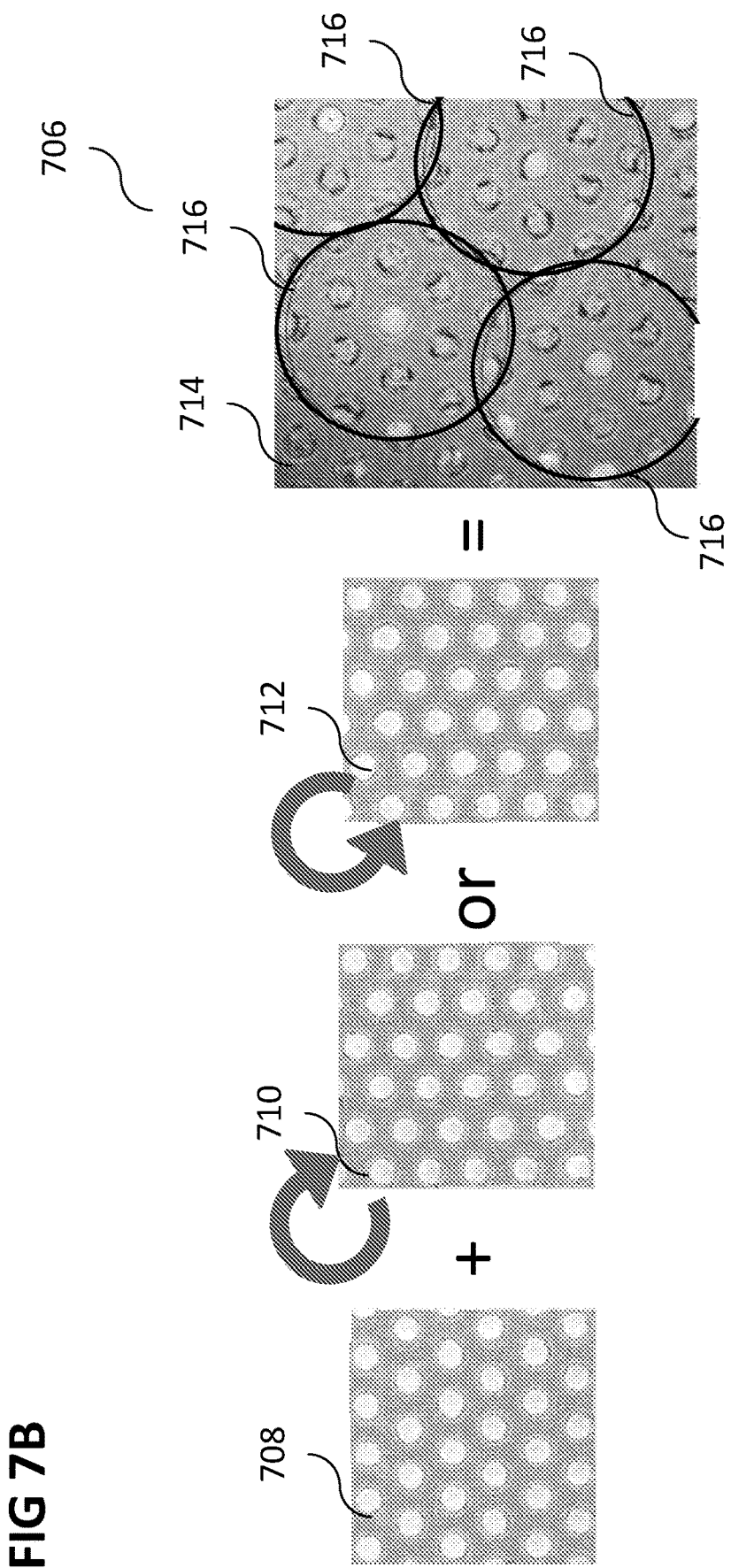
FIG. 7B shows an illustration of a fabrication process according to various embodiments.

FIG. 7B shows an illustration 706 of a fabrication process (in other words: manufacturing process) according to various embodiments. A first layer 708 of mesh may be overlaid (in other words: stacked) with a second layer of mesh. The second layer of mesh may be rotated by 90 degrees (for example clockwise, like indicated by 710; or for example counter-clockwise, like indicated by 712) with respect to the first layer 708. It will be understood that with the single mesh as shown in FIG. 7A, the result of the clockwise turning is the same as the result of the counter-clockwise turning. In other words: an overlay of two single meshes may be provided, to form a repetitive ring pattern 714. The rings 716 on which holes are formed will be described in more detail with reference to FIG. 8.

Figure 8:
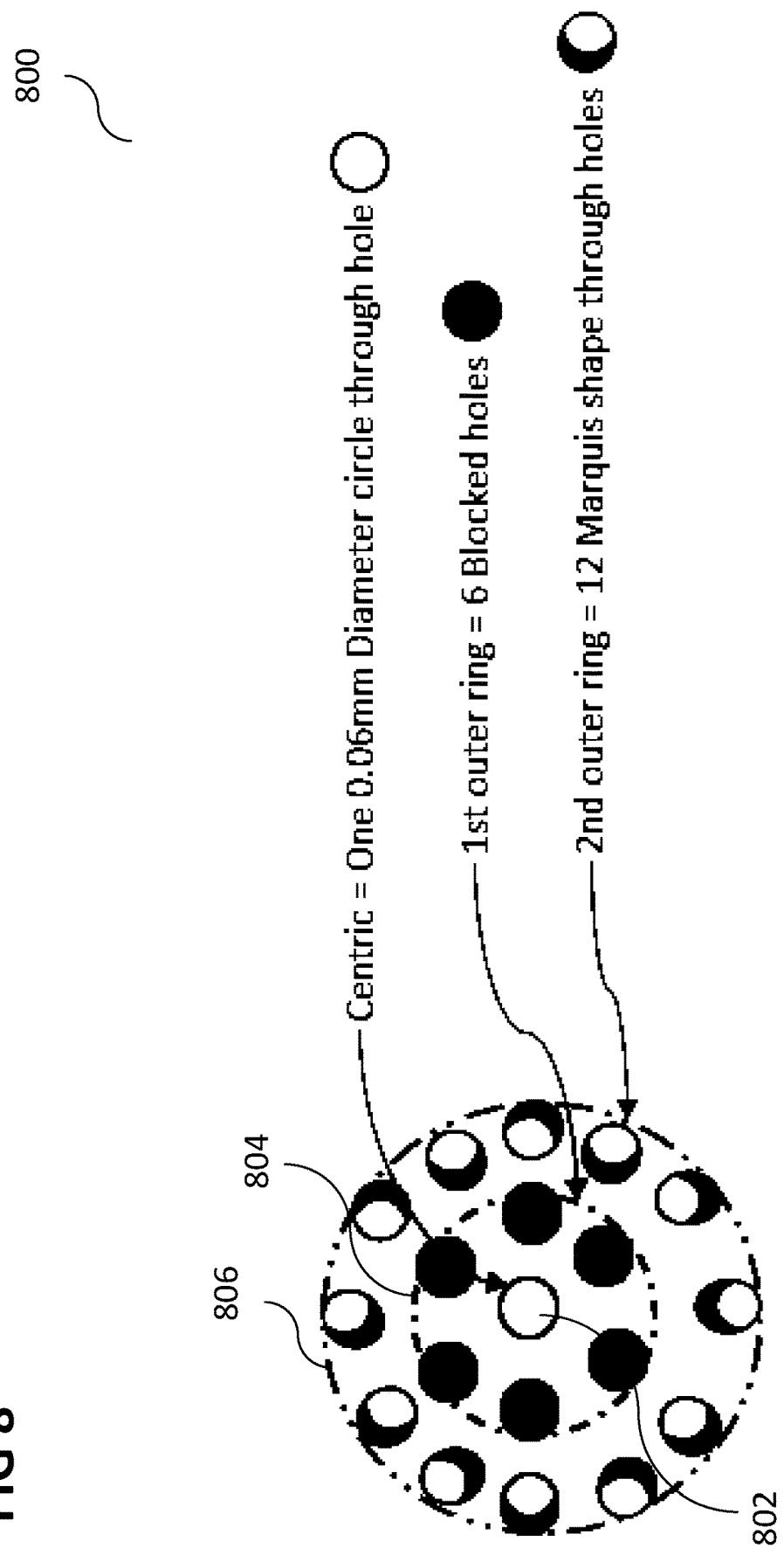
FIG. 8 shows an illustration of a mesh pattern according to various embodiments.

FIG. 8 shows an illustration 800 of a mesh pattern (for example corresponding to the single ring pattern of the repetitive ring pattern 714 as shown in FIG. 7) according to various embodiments. Each ring pattern includes a centric hole 802 (which may be provided at locations where holes of the first mesh and the second mesh are aligned), for example with a diameter of 0.06 mm. On a first outer ring 804, 6 blocked holes may be provided (for examples where holes of the first mesh are entirely obstructed by the second mesh, or vice versa). On a second outer ring 806, 12 marquis shape through holes may be provided (for examples where holes of the first mesh are partially obstructed by the second mesh, or vice versa).

Figure 9:
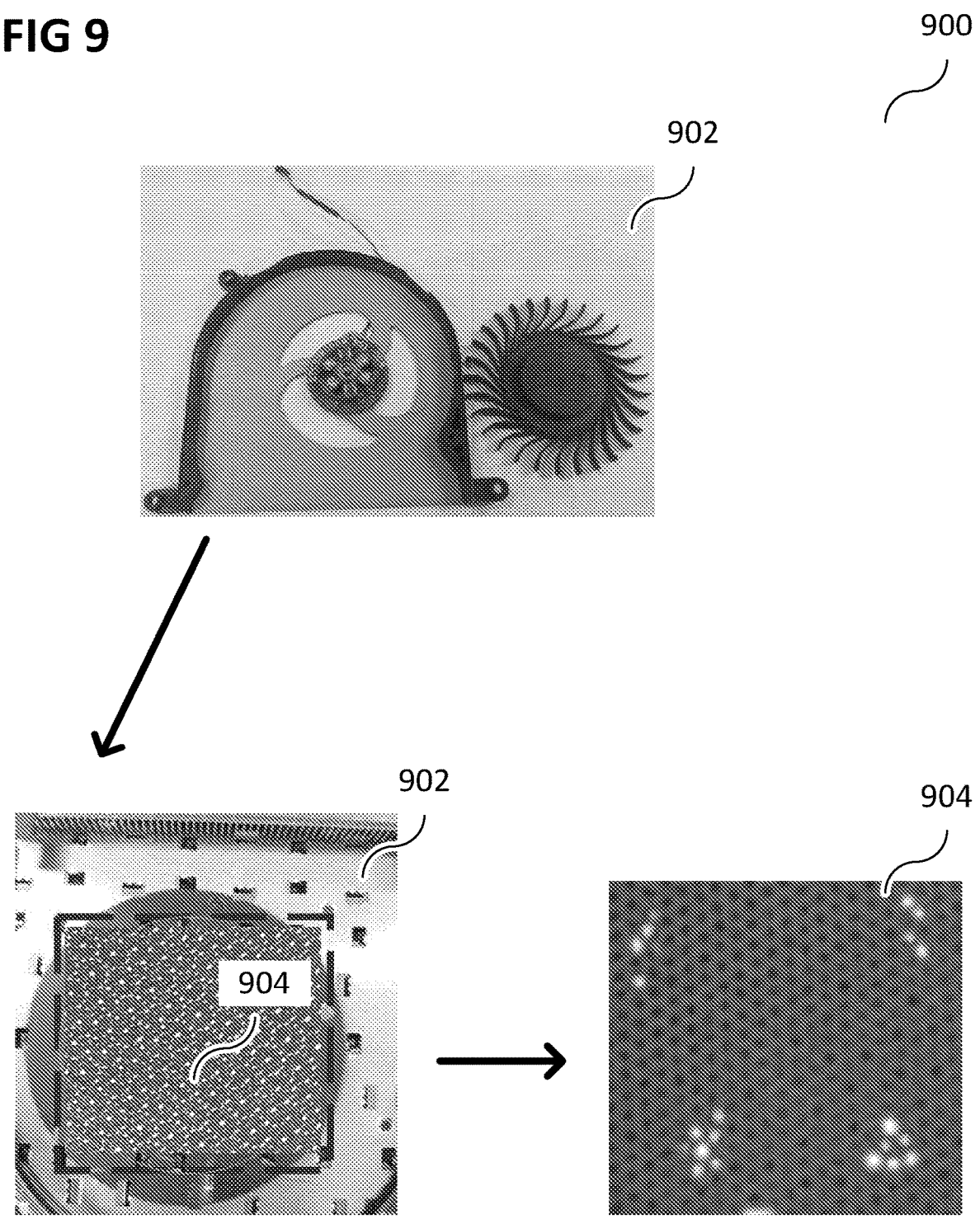
FIG. 9 shows an illustration of an application area according to various embodiments.

FIG. 9 shows an illustration 900 of an application area according to various embodiments. According to various embodiments, a mesh 904 may be provided between a fan 902 and a keypad module. For example, the mesh may be provided at a bottom side of the fan 902. The top portion of FIG. 9 shows the fan 902. The bottom left portion of FIG. 9 shows the keypad module bottom side with the mesh 904. The bottom right portion of FIG. 9 shows single keypad holes blocked by the mesh 904. The mesh blocked holes may limit and attenuate the noise peak at the keypad holes.

Like shown in FIG. 9, in a single ring pattern (which in total includes 19 holes, counting unobstructed, partially obstructed, and entirely obstructed holes), the 1st outer ring 804 with 6 full holes may be fully blocked, and the 2nd outer ring 806 may be limited by 12 Marquis shape through holes. With just 1 center hole 802 and 12 Marquis holes partial open, noise may be at its lowest as compared to a simple circular mesh design.

Figure 10A:
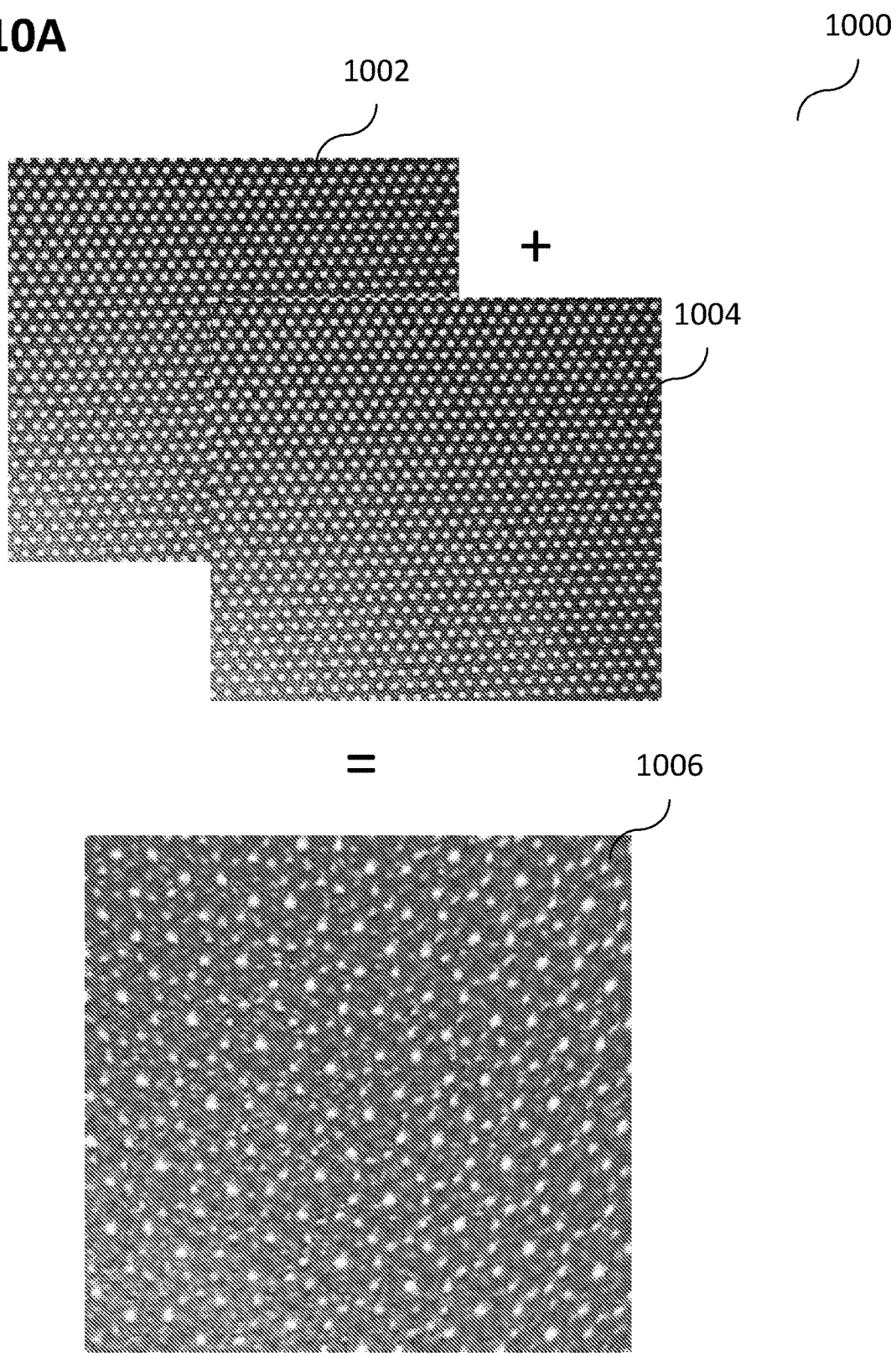
FIG. 10A, FIG. 10B, and FIG. 10C show various components according to various embodiments and an assembly according to various embodiments.
Figure 10B:
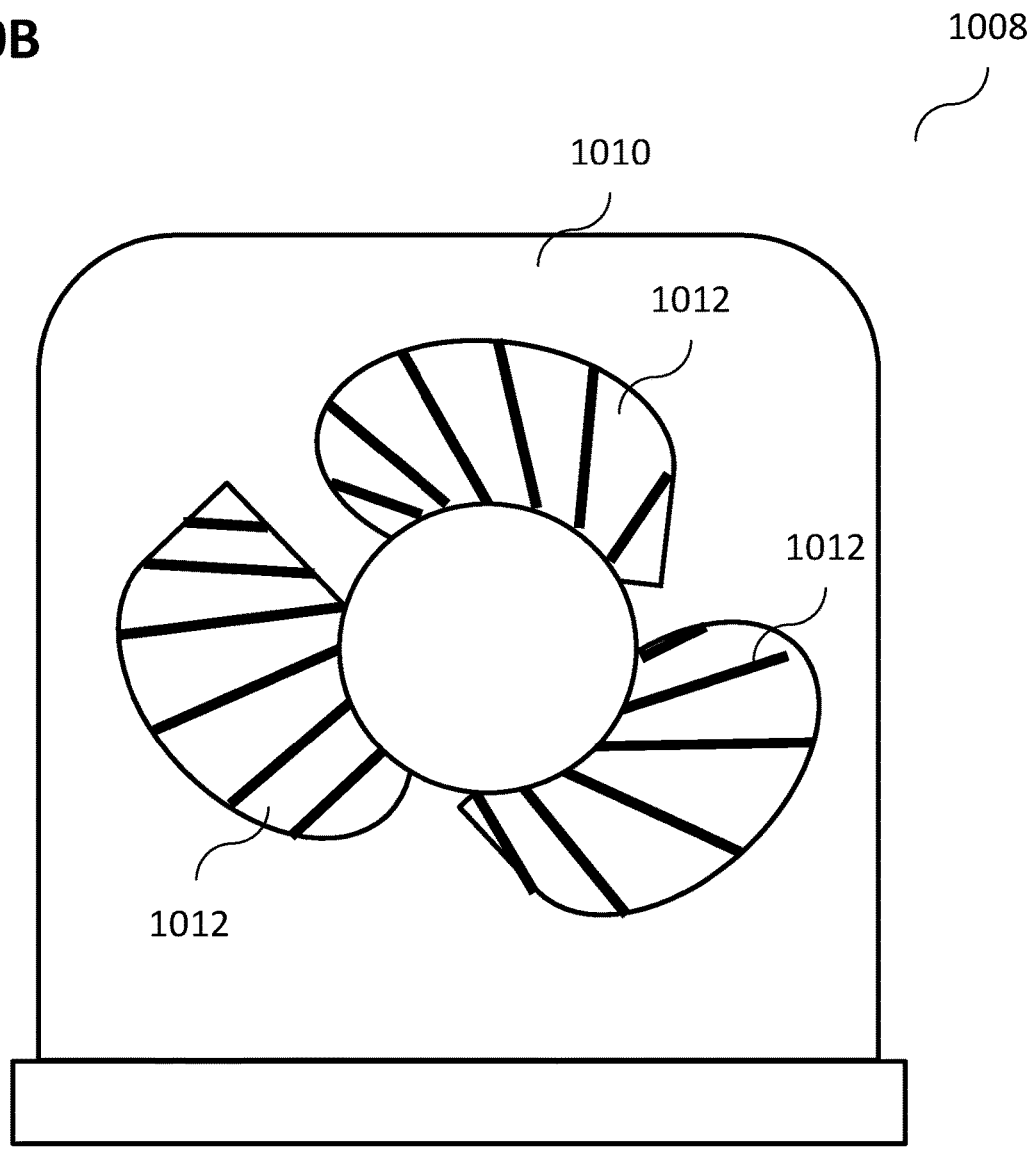
Figure 10C:
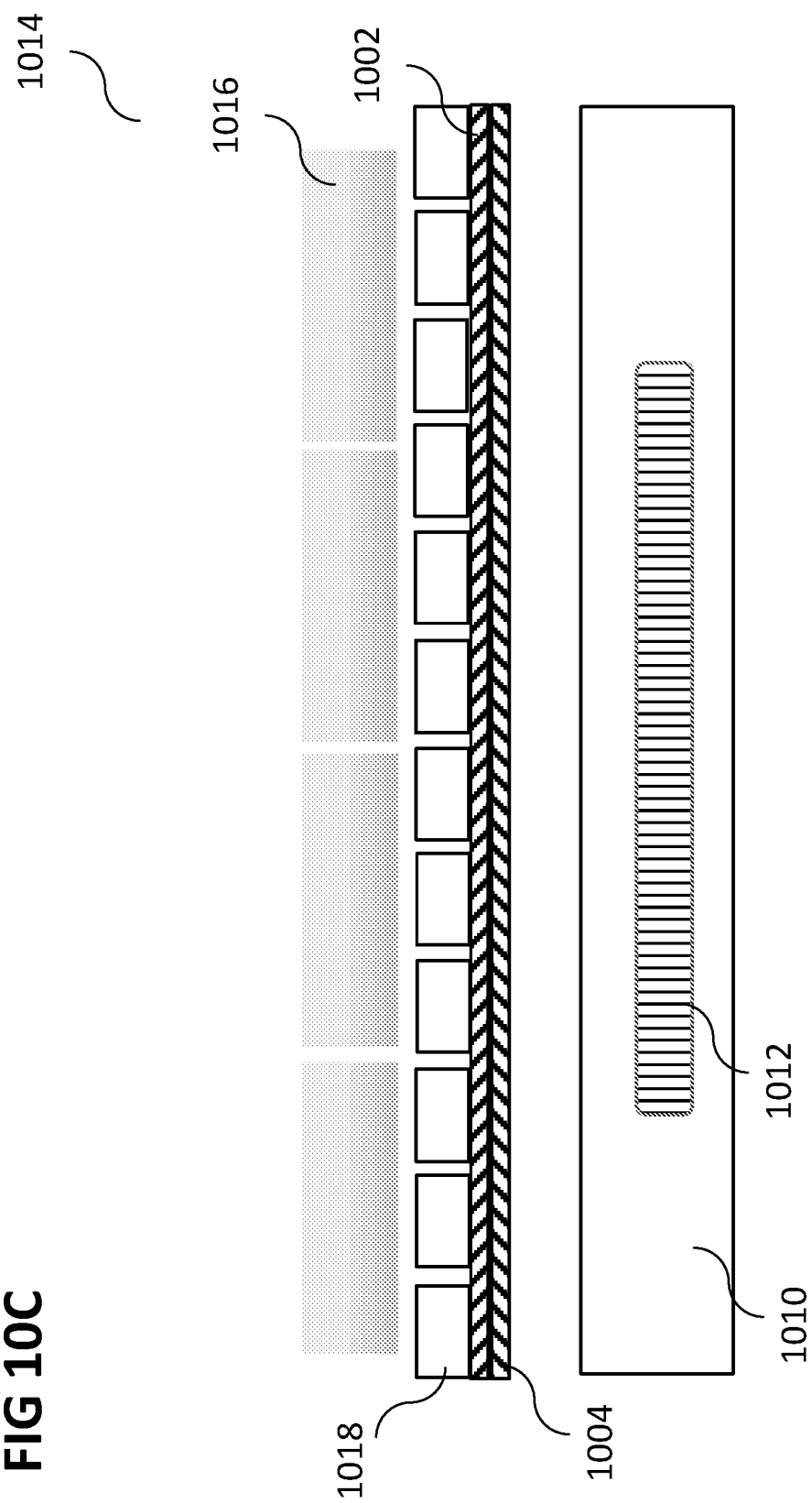

FIG. 10A, FIG. 10B, and FIG. 10C show illustrations 1000, 1008, and 1014 of various components according to various embodiments and an assembly according to various embodiments. A first mesh 1002 (in other words: a first mesh layer), a second mesh 1004 (in other words: a second mesh layer), a blower 1010 (for example a DC (direct current) brushless blower), blower blades 1012 (for example DC brushless blower blades), keycaps 1016, and a keyboard base 1018 are shown. FIG. 10A shows the first mesh 1002 and the second mesh 1004, and illustrates a mesh assembly resulting from stacking the first mesh 1002 and the second mesh 1004. FIG. 10B shows the blower 1010 with blower blades 1012. FIG. 10C shows a side view of an assembly in a keyboard according to various embodiments.

According to various embodiments, whining noises which are present in an audible range (for example in a range between 1 kHz and 2.5 kHz) when system fans (for example of a brushless quiet type) are spinning at high speed, may be attenuated.

According to various embodiments, by using an ultra thin mesh holes sheet attach to the keypad side, this whining sound may be suppressed to a low level from the key caps breathing holes.

According to various embodiments, devices and methods may be provided which are simple to implement and flexible to use to suit individual requirements. Various devices may be applicable to all systems with fans attached which are the noise source. According to various embodiments, a total thickness required may be just 0.3 mm (which may correspond to the thickness of the double layers mesh according to various embodiments). According to various embodiments, a quieter environment in gaming or video stream mode may be created.

With the increasing demand to dissipate more heat generate from high performance CPUs (central processing units) and GPUs (graphics processing units), system fans may require to spin at maximum speed more frequently, and a system without annoying fan noise according to various embodiments may provide good customer experience and a potential marketing plus point.

The following examples pertain to further embodiments.

Example 1 is a mesh assembly comprising: a first mesh comprising a plurality of first holes arranged according to a pattern; a second mesh comprising a plurality of second holes arranged according to the pattern; wherein the second mesh is provided on top of the first mesh; and wherein at least one hole of the plurality of first holes is at least partially obstructed by the second mesh.

In example 2, the subject-matter of example 1 can optionally include that the pattern comprises a pattern in which each hole is provided at a pre-determined distance from a closest further hole.

In example 3, the subject-matter of example 2 can optionally include that the distance is in a range between 0.01 mm and 0.1 mm.

In example 4, the subject-matter of example 3 can optionally include that the distance is at least substantially equal to 0.04 mm.

In example 5, the subject-matter of any one of examples 1 to 4 can optionally include that the pattern comprises a pattern in which each hole is provided at a pre-determined distance from all neighboring holes.

In example 6, the subject-matter of any one of examples 1 to 5 can optionally include that the first mesh comprises a metal mesh; and wherein the second mesh comprises a metal mesh.

In example 7, the subject-matter of any one of examples 1 to 6 can optionally include that each hole of the first mesh and each hole of the second mesh has a diameter in a range of 0.01 mm to 0.1 mm.

In example 8, the subject-matter of example 7 can optionally include that each hole of the first mesh and each hole of the second mesh has a diameter at least substantially equal to 0.06 mm.

In example 9, the subject-matter of any one of examples 1 to 8 can optionally include that the pattern comprises a pattern in which an angle between a center of a hole and two corresponding centers of two neighboring holes of the hole is in a range of 30 degrees to 90 degrees.

In example 10, the subject-matter of example 9 can optionally include that the pattern comprises a pattern in which an angle between a center of a hole and two corresponding centers of two neighboring holes of the hole is at least substantially 60 degrees.

In example 11, the subject-matter of any one of examples 1 to 10 can optionally include that the pattern comprises a repetitive pattern.

In example 12, the subject-matter of any one of examples 1 to 11 can optionally include that the pattern comprises a regular pattern.

In example 13, the subject-matter of any one of examples 1 to 12 can optionally include that at least one hole of the first mesh and at least one hole of the second mesh are aligned; and wherein the first mesh and the second mesh are rotated by a pre-determined angle with respect to the pattern.

In example 14, the subject-matter of any one of examples 1 to 13 can optionally include that the pre-determined angle is in a range of −150 degrees to 150 degrees.

In example 15, the subject-matter of any one of examples 1 to 14 can optionally include that the pre-determined angle is one of at least substantially −90 degrees or at least substantially 90 degrees.

Example 16 is a computing system comprising: a housing with an opening; a fan; and the mesh assembly of any one of examples 1 to 15 provided between the fan and the opening.

Example 17 is a method for manufacturing a mesh assembly, the method comprising: providing a first mesh comprising a plurality of first holes arranged according to a pattern; providing on top of the first mesh a second mesh comprising a plurality of second holes arranged according to the pattern so that at least one hole of the plurality of first holes is at least partially obstructed by the second mesh.

In example 18, the subject-matter of example 17 can optionally include that the pattern comprises a pattern in which each hole is provided at a pre-determined distance from a closest further hole.

In example 19, the subject-matter of example 18 can optionally include that the distance is in a range between 0.01 mm and 0.1 mm.

In example 20, the subject-matter of example 19 can optionally include that the distance is at least substantially equal to 0.04 mm.

In example 21, the subject-matter of any one of examples 17 to 20 can optionally include that the pattern comprises a pattern in which each hole is provided at a pre-determined distance from all neighboring holes.

In example 22, the subject-matter of any one of examples 17 to 21 can optionally include that the first mesh comprises a metal mesh; and wherein the second mesh comprises a metal mesh.

In example 23, the subject-matter of any one of examples 17 to 22 can optionally include that each hole of the first mesh and each hole of the second mesh has a diameter in a range of 0.01 mm to 0.1 mm.

In example 24, the subject-matter of example 23 can optionally include that each hole of the first mesh and each hole of the second mesh has a diameter at least substantially equal to 0.06 mm.

In example 25, the subject-matter of any one of examples 17 to 24 can optionally include that the pattern comprises a pattern in which an angle between a center of a hole and two corresponding centers of two neighboring holes of the hole is in a range of 30 degrees to 90 degrees.

In example 26, the subject-matter of example 25 can optionally include that the pattern comprises a pattern in which an angle between a center of a hole and two corresponding centers of two neighboring holes of the hole is at least substantially 60 degrees.

In example 27, the subject-matter of any one of examples 17 to 26 can optionally include that the pattern comprises a repetitive pattern.

In example 28, the subject-matter of any one of examples 17 to 27 can optionally include that the pattern comprises a regular pattern.

In example 29, the subject-matter of any one of examples 17 to 28 can optionally include that at least one hole of the first mesh and at least one hole of the second mesh are aligned; and wherein the first mesh and the second mesh are rotated by a pre-determined angle with respect to the pattern.

In example 30, the subject-matter of any one of examples 17 to 29 can optionally include that the pre-determined angle is in a range of −150 degrees to 150 degrees.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A mesh assembly comprising:
   a first mesh sheet and a second mesh sheet, wherein the second mesh sheet is stacked and rotated on top of and attached to the first mesh sheet;
   the first mesh sheet comprising a plurality of first holes arranged according to a first pattern, wherein the first pattern comprises a plurality of first centric holes with a first surrounding holes;
   the second mesh sheet comprising a plurality of second holes arranged according to a second pattern, wherein the second pattern comprises a plurality of second centric holes with a second surrounding holes; and
   wherein the first and second centric holes are fully aligned and unobstructed and wherein the first surrounding holes are at least partially obstructed by the second mesh sheet for noise attenuation.

2. The mesh assembly of claim 1,
   wherein the first and second patterns further comprise patterns in which each hole is provided at a pre-determined distance from all neighboring holes.

3. The mesh assembly of claim 1,
   wherein each hole of the first mesh sheet and each hole of the second mesh sheet has a diameter in a range of 0.01 mm to 0.1 mm.

4. The mesh assembly of claim 1,
   wherein the first and second patterns comprise patterns in which an angle between a center of a hole and two corresponding centers of two neighboring holes of the hole is in a range of 30 degrees to 90 degrees.

5. The mesh assembly of claim 1,
   wherein the first and second patterns comprise repetitive pattern.

6. The mesh assembly of claim 1,
   wherein the first pattern and second pattern are identical.

7. The mesh assembly of claim 1,
   wherein the first surrounding holes comprise a first ring of holes surrounding the first centric hole that is fully obstructed by the second mesh sheet and a second ring of holes that is at least partially obstructed by the second mesh sheet forming marquis-shaped through holes with the second surrounding holes of the second pattern; and
   wherein the first mesh sheet and the second mesh sheet are rotated by a pre-determined angle with respect to the first and second patterns.

8. The mesh assembly of claim 7,
   wherein the pre-determined angle is in a range of −150 degrees to 150 degrees.

9. The mesh assembly of claim 1,
   wherein the first mesh sheet and/or the second mesh sheet are made from metal or polyethylene.

10. A computing system comprising:
an ultra-thin housing with an opening;
a fan; and
a mesh assembly provided between the fan and the opening for noise attenuation, the mesh assembly comprises:
   a first mesh sheet and a second mesh sheet, wherein the second mesh sheet is stacked and rotated on top of and attached to the first mesh sheet;
   the first mesh sheet comprising a plurality of first holes arranged according to a first pattern, wherein the first pattern comprises a plurality of first centric holes with a first surrounding holes;
   the second mesh sheet comprising a plurality of second holes arranged according to a second pattern, wherein the second pattern comprises a plurality of second centric holes with a second surrounding holes; and
   wherein the first and second centric holes are fully aligned and unobstructed and wherein the first surrounding holes are at least partially obstructed by the second pattern of the second mesh sheet.

11. A method for manufacturing a mesh assembly, the method comprising:
forming a first mesh sheet comprising a plurality of first holes arranged according to a first pattern, wherein the first pattern comprises a plurality of first centric holes with a first surrounding holes;
forming a second mesh comprising a plurality of second holes arranged according to a second pattern, wherein the second pattern comprises a plurality second centric holes with a second surrounding holes;
stacking and rotating the second mesh sheet on top of the first mesh sheet so that the first and second centric holes are fully aligned and unobstructed and wherein the first surrounding holes are at least partially obstructed by the second pattern of the second mesh sheet.

12. The method of claim 11,
wherein the first and second patterns comprise patterns in which each hole is provided at a pre-determined distance from all neighboring holes.

13. The method of claim 11,
wherein each hole of the first mesh sheet and each hole of the second mesh sheet has a diameter in a range of 0.01 mm to 0.1 mm.

14. The method of claim 11,
wherein the first and second patterns comprise patterns in which an angle between a center of a hole and two corresponding centers of two neighboring holes of the hole is in a range of 30 degrees to 90 degrees.

15. The method of claim 11,
wherein the first and second patterns comprise repetitive patterns.

16. The method of claim 11,
wherein the first and second patterns are identical.

17. The method of claim 11,
wherein the stacking of the second mesh sheet on top of the first mesh sheet causes the first surrounding holes of the first pattern and the second surrounding holes of the second pattern to form a first ring of holes of the plurality of first holes surrounding the first centric hole that is fully obstructed by the second mesh sheet and a second ring of holes that is at least partially obstructed by the second mesh sheet forming marquis-shaped through holes with the second surrounding holes of the second pattern; and
wherein the first mesh sheet and the second mesh sheet are rotated by a pre-determined angle with respect to the first and second patterns.

18. The method of claim 17,
wherein the pre-determined angle is in a range of −150 degrees to 150 degrees.

* * * * *